US008839162B2

(12) United States Patent
Amundson et al.

(10) Patent No.: US 8,839,162 B2
(45) Date of Patent: Sep. 16, 2014

(54) SPECIFYING CIRCUIT LEVEL CONNECTIVITY DURING CIRCUIT DESIGN SYNTHESIS

(75) Inventors: Michael D. Amundson, Oronoco, MN (US); Dorothy Kucar, White Plains, NY (US); Ruchir Puri, Baldwin Place, NY (US); Chin Ngai Sze, Austin, TX (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 12/835,780

(22) Filed: Jul. 14, 2010

(65) Prior Publication Data

US 2012/0017186 A1    Jan. 19, 2012

(51) Int. Cl.
*G06F 9/45* (2006.01)
*G06F 17/50* (2006.01)

(52) U.S. Cl.
CPC .................................. *G06F 17/5045* (2013.01)
USPC ............ 716/104; 716/100; 716/101; 716/103

(58) Field of Classification Search
USPC .................................. 716/100, 101, 103, 104
See application file for complete search history.

(56) References Cited

U.S. PATENT DOCUMENTS

| | | | |
|---|---|---|---|
| 5,694,481 A | 12/1997 | Lam et al. | |
| 5,818,729 A | 10/1998 | Wang et al. | |
| 6,311,309 B1 | 10/2001 | Southgate | |
| 6,973,630 B1 | 12/2005 | Dao et al. | |
| 7,200,544 B1 | 4/2007 | McCown | |
| 7,404,161 B2 | 7/2008 | Dutt et al. | |
| 2002/0133784 A1* | 9/2002 | Gupta et al. | 716/1 |
| 2002/0162086 A1* | 10/2002 | Morgan | 716/18 |
| 2003/0212967 A1* | 11/2003 | Halstead | 716/3 |
| 2005/0273683 A1* | 12/2005 | Cote et al. | 714/726 |
| 2005/0289498 A1* | 12/2005 | Sawkar et al. | 716/18 |
| 2006/0190870 A1* | 8/2006 | Chen et al. | 716/5 |
| 2006/0282800 A1 | 12/2006 | Varadarajan | |
| 2006/0294491 A1* | 12/2006 | Becker | 716/18 |
| 2008/0071514 A1* | 3/2008 | Yuri | 703/15 |
| 2008/0189663 A1* | 8/2008 | Tretz | 716/4 |
| 2009/0144690 A1* | 6/2009 | Spackman et al. | 716/18 |
| 2009/0241082 A1* | 9/2009 | Amundson et al. | 716/8 |
| 2010/0153899 A1* | 6/2010 | McElvain | 716/18 |
| 2011/0209108 A1* | 8/2011 | Seno | 716/102 |

OTHER PUBLICATIONS

Nadeau et al., "Pseudowire Virtual Circuit Connectivity Verification (VCCV): A Control Channel for Pseudowires"; ip.com IPCOM000165590D; Dec. 22, 2007.
Pomeranz et al., "Design and Synthesis for Testability of Synchronous Sequential Circuits Based on Strong-Connectivity," Proc. 23rd Int. Symp. Fault-Tolerant Computing, Jun. 1993, pp. 492-501.

* cited by examiner

*Primary Examiner* — Thuan Do
*Assistant Examiner* — Brian Ngo
(74) *Attorney, Agent, or Firm* — Cantor Colburn LLP; Preston Young

(57) ABSTRACT

Exemplary embodiments include a method for modifying a circuit synthesis flow having automated instructions, the method including receiving circuit design input for a circuit design, receiving custom specifications to the circuit design input, synthesizing high level logic from the circuit design input, placing logic on the circuit design, refining the circuit design and generating a circuit description from the circuit design.

25 Claims, 18 Drawing Sheets

Master VHDL 305

```
architecture ex1 of ex1 is
  signal  a_top : std_ulogic;
  signal  b_top : std_ulogic;
  signal  y_top : std_ulogic;
  ... additional signal declarations
begin
  ... additional master logic y_top <= a_top and b_top;

... additional master logic end ex1;
```

Custom Decomposition 310

```
I0: entity stdcell.nand2
    generic map (width => 1, size => "10", vt =>"r")
    PORT MAP
    ( a => a_top ,
      b => b_top ,
      y => y_int
    );
I1 : entity stdcell.invert
    generic map (width => 1, size => "20", vt =>"r")
    PORT MAP
    ( a => y_int ,
      y => y_top
    );
```

FIG. 3

Master VHDL 305

```
architecture ex1 of ex1 is
signal  a_top : std_ulogic;
signal  b_top : std_ulogic;
signal  y_top : std_ulogic;
... additional signal declarations
begin
... additional master logic
-- swap and0 begin ———401
y_top <= a_top and b_top;  ———306
-- swap and0 end ———402
... additional master logic
end ex1;
```

Custom Decomposition 310

```
-- swap and0 begin ———403
I0 : entity stdcell.nand2
  generic map (width => 1, size => "10", vt =>"r")
  PORT MAP
  ( a => a_top ,
    b => b_top ,
    y => y_int
  );
I1 : entity stdcell.invert
  generic map (width => 1, size => "20", vt =>"r")
  PORT MAP
  ( a => y_int ,
    y => y_top
  );
-- swap and0 end ———404
```

FIG. 4

Master VHDL 305

Custom Decomposition 310

```
architecture ex1 of ex1 is signal   a_top : std_ulogic;
signal   b_top : std_ulogic;
signal   y_top : std_ulogic;

... additional signal declarations begin

... additional master logic                    ── 401
-- swap and0 begin
y_top <= a_top and b_top;                      ── 306
-- swap and0 end
... additional master logic                    ── 402
...
end ex1;
```

Custom Decomposition 306:
```
-- swap and0 begin                             ── 403
and_0 : entity
work.ex_and
   port map (
      a => a_top ,
      b => b_top ,
      y => y_int
   );                                          ── 404
-- swap and0 end
```

Supplemental Custom Decomposition File 505

```
Entity ex_and IS
   PORT(
      a : IN    std_ulogic;
      b : IN    std_ulogic;
      y : OUT   std_ulogic;
   );
Attribute BLOCK_TYPE of ex_and : entity is leaf;
End ex_and;

architecture ex_and of ex_and is
signal  y_b   : std_ulogic
signal  y_buf : std_ulogic
begin
I0 : entity stdcell.nand2
   generic map (width => 1, size => "10" , vt =>"r")
   PORT MAP
   ( a => a,
     b => b,
     y => y_b
   );
I1 : entity stdcell.invert
   generic map (width => 1, size => "20" , vt =>"r")
   PORT MAP
   ( a => y_b,
     y => y_buf
   );
   y <= y_buf;
end ex_and;
```

| Latch | Logical LCB | Physical LCB |
|---|---|---|
| Latch<0> | lcb_a | lcb_clone1 |
| Latch<1> | lcb_a | lcb_clone1 |
| ... | | |
| Latch<N/M-1> | lcb_a | lcb_clone1 |
| Latch<N/M> | lcb_a | lcb_clone2 |
| Latch<N/M+1> | lcb_a | lcb_clone2 |
| ... | | |
| Latch<2N/M-1> | lcb_a | lcb_clone2 |
| Latch<(M-1)(N/M)> | lcb_a | lcb_clone3 |
| Latch<(M-1)(N/M)+1> | lcb_a | lcb_clone3 |
| ... | | |
| Latch<N-1> | lcb_a | lcb_clone3 |

FIG. 8

| Latch | Logical LCB | Physical LCB | Merged Latch |
|---|---|---|---|
| Latch<0> | lcb_a | lcb_clone1 | latch_a1_01 |
| Latch<1> | lcb_a | lcb_clone1 | latch_a1_01 |
| ... | | | |
| Latch<N/M-2> | lcb_a | lcb_clone1 | latch_a1_x |
| Latch<N/M-1> | lcb_a | lcb_clone1 | latch_a1_x |
| Latch<N/M> | lcb_a | lcb_clone2 | latch_a2_01 |
| Latch<N/M+1> | lcb_a | lcb_clone2 | latch_a2_01 |
| ... | | | |
| Latch<2N/M-2> | lcb_a | lcb_clone2 | latch_a2_x |
| Latch<2N/M-1> | lcb_a | lcb_clone2 | latch_a2_x |

```
<!--Comment: force a dual-bit latches -->
<nbit include="Latch<0> Latch<1>"> latch_a1_01 </nbit>
<nbit include="Latch<N/M-2> Latch<N/M-1>"> latch_a1_x </nbit>
<nbit include="Latch<N/M> Latch<N/M+1>"> latch_a2_01 </nbit>
<nbit include="Latch<2N/M-2> Latch<2N/M-1> "> latch_a2_x </nbit>

<!--Force latches to an lcb -->
<latch lcb="lcb_a" clone="lcb_clone1"> latch_a1_01 </latch>
<latch lcb="lcb_a" clone="lcb_clone1"> latch_a1_x </latch>
<latch lcb="lcb_a" clone="lcb_clone2"> latch_a2_01 </latch>
<latch lcb="lcb_a" clone="lcb_clone2"> latch_a2_x </latch>

<!-- Set lcb properties -->
<lcb exclusive=true > "lcb_clone1" </lcb>
<lcb exclusive=false > "lcb_clone2" </lcb>
```

SPECIFYING CIRCUIT LEVEL CONNECTIVITY DURING CIRCUIT DESIGN SYNTHESIS

BACKGROUND

The present invention relates to logic circuit design, and more specifically, to systems and methods for specifying circuit level connectivity during logic circuit synthesis without modifying the logic level description.

VLSI design methodologies, as well as various other approaches to complex designs, employ levels of abstraction to limit complexity during steps in the design process. Synthesis is a common approach to VLSI design that converts a higher level abstraction into a lower, more detailed, level of abstraction. While there are various types of synthesis, typical synthesis processes convert a logic level description of a design into a circuit level description. Human designers can influence synthesis by modifying the logic description while maintaining the same functionality. Often these modifications expand the level of detail in the logic description. However, modifying the logical level to influence the circuit level can reduce the clarity of the logic to human designers and can require re-verification to ensure the new logic is functionally correct. In addition, designs are often owned and implemented by separate designers at the logic and circuit level. For example, a logic designer may code and own the logic level description, while a circuit designer implements and owns the design at the circuit (either via synthesis or custom design).

The synthesis processes are typically implemented as CAD (computer-aided design) software and require little human intervention. In contrast, a custom VLSI design methodology requires a human designer to perform the expansion of details from the logic level to circuit level. Although the automation of synthesis provides an inherent productivity advantage, there are some scenarios in VLSI design where experienced human designers can produce better results. Thus, it would be desirable if human designers could control portions of the synthesis process.

SUMMARY

Exemplary embodiments include a method for modifying a logic circuit synthesis flow having automated instructions, the method including receiving circuit design input for a circuit design, receiving a side file having custom specifications to the circuit design input, bypassing the automated circuit design input for the circuit design, synthesizing high level logic from the circuit design input, placing logic on the circuit design, refining the circuit design and generating a circuit description from the circuit design.

Additional exemplary embodiments include a computer program product for modifying a logic circuit synthesis flow having automated instructions, the computer program product having a non-transitory computer readable medium including instructions for causing a computer to implement a method, the method including receiving circuit design input for a circuit design, receiving side file having custom specifications to the circuit design input, bypassing the automated circuit design input for the circuit design, synthesizing high level logic from the circuit design input, placing logic on the circuit design, refining the circuit design and generating a circuit description from the circuit design.

Additional exemplary embodiments include a method of modifying a logic circuit synthesis flow having automated instructions, the method including receiving a circuit design input, running high level synthesis for the circuit design, receiving custom decomposition instructions related to high level synthesis of the circuit design and for bypassing portions of the automated instructions, running placement algorithms for non-sequential logic of the circuit design, receiving custom decomposition instructions related to high level synthesis of the circuit design and for bypassing portions of the automated instructions, running clock optimization and latch mapping algorithms for the circuit design and receiving custom decomposition instructions related clock optimization and latch mapping and for bypassing portions of the automated instructions.

Further exemplary embodiments include a computer program product for modifying a logic circuit synthesis flow having automated instructions, the computer program product having a non-transitory computer readable medium including instructions for causing a computer to implement a method, the method including receiving a circuit design input, running high level synthesis for the circuit design, receiving custom decomposition instructions related to high level synthesis of the circuit design and for bypassing portions of the automated instructions, running placement algorithms for non-sequential logic of the circuit design, receiving custom decomposition instructions related to high level synthesis of the circuit design and for bypassing portions of the automated instructions, running clock optimization and latch mapping algorithms for the circuit design and receiving custom decomposition instructions related clock optimization and latch mapping and for bypassing portions of the automated instructions.

Further exemplary embodiments include a system for modifying a logic circuit synthesis flow, the system including a processor configured to receive circuit design input for a circuit design, receive custom specifications to the circuit design input, synthesize high level logic from the circuit design input, place logic on the circuit design, refine the circuit design and generate a circuit description from the circuit design, a memory operationally coupled to the processor, the memory including automated instructions for the logic circuit synthesis flow, a correspondence file including custom user-provided decomposition instructions for bypassing the automated instructions and a supplemental correspondence file including custom instantiations.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 illustrates an example in which a custom decomposition can provide a precise definition of logic level RTL;

FIG. 4 illustrates the example of FIG. 3, including comment tags in accordance with exemplary embodiments;

FIG. 5 illustrates the example of FIGS. 3 and 4, further illustrating a supplemental custom decomposition file in accordance with exemplary embodiments;

FIG. 8 illustrates an example of shorthand notation implemented in an exemplary correspondence file;

FIG. 11 illustrates an example of an implementation of a shorthand notation that includes latch merging in accordance with exemplary embodiments;

FIG. 12 illustrates an example of an implementation of a shorthand implementing XML in accordance with exemplary embodiments;

DETAILED DESCRIPTION

In exemplary embodiments, the systems and methods described herein enable additional input to a logic synthesis program that precisely controls portions of a circuit level netlist generated by the synthesis program, and without modifying the original logic level description. The input is provided separately from the typical logic level description upon which the synthesis programs operate. The exemplary systems and methods described herein enable register transfer level (RTL) implementations, which can be competing, including but not limited to: 1) a functional RTL description representing the behavior of the design; and 2) a detailed RTL described of design used by synthesis for implementation. In exemplary embodiments, a mechanism effectively decouples the competing RTL implementations. In exemplary embodiments, the functional RTL description is maintained as a master (golden) data, but allows a redefinition of specific portions of the RTL, allowing additional details for implementation. RTL redefinition does not modify the functional RTL and only the redefined portion needs to be maintained, rather than completely duplicating the functional RTL. In addition, there are cases where shorthand notations can convey precise designer control, side stepping the need for a complete RTL description. The construction of the clocking network in a circuit is a specific scenario where precise designer control is advantageous. A common clocking network from the logic level perspective includes a global clock connected to local clock buffers (LCBs). The LCBs generate a local clock that drives latches, (i.e., state storage elements). At the circuit level, LCBs are often cloned and latches are merged into compounds cells. In some design scenarios human designers can therefore perform these optimizations.

The exemplary embodiments described herein can supply an additional input to the synthesis program that precisely controls portions of the circuit level netlist generated by synthesis, without modifying the original logic level description.

Figure 1:
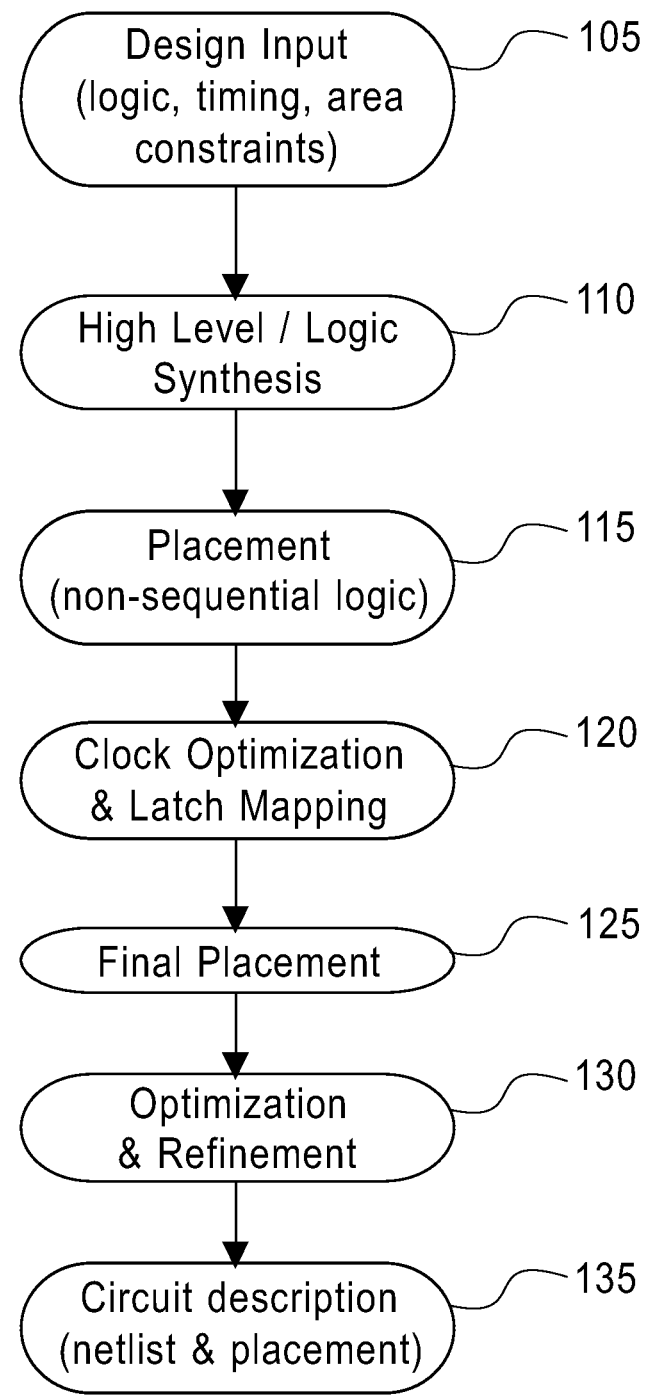
FIG. 1 illustrates a conventional synthesis flow method.

FIG. 1 illustrates a conventional synthesis flow method 100. Present synthesis programs implementing method 100 take design inputs 105 and generate design outputs 135. The steps included therein can include logic synthesis at block 110, initial timing driven placement at block 115, clock optimization and latch mapping at block 120, final placement at block 125, as well as optimization and refinement at block 130.

Figure 2:
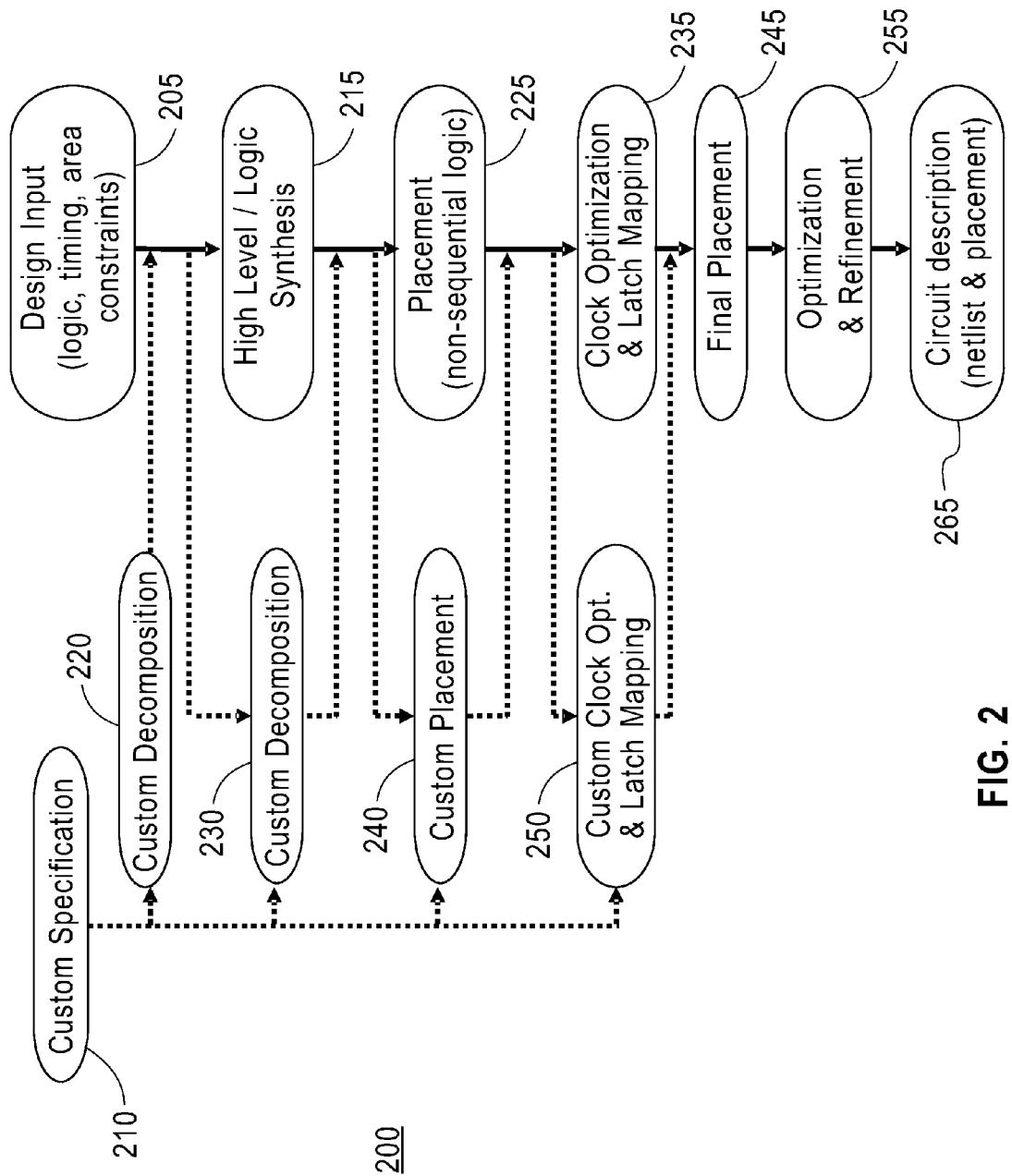
FIG. 2 illustrates a method for specifying circuit level connectivity during logic circuit synthesis without modifying the logic level description in accordance with exemplary embodiments.

FIG. 2 illustrates a method 200 for specifying circuit level connectivity during logic circuit synthesis without modifying the logic level description in accordance with exemplary embodiments. The method 200 can be a RTL synthesis flow, which receive a designer supplied description that does not require modifying the input at block 205 to synthesis. Additional input, as described herein, specifies precisely how certain portions of the netlist & placement can be created, in contrast to using the conventional synthesis flow. In exemplary embodiments, custom specification bypasses various steps in the conventional synthesis flow as shown in FIG. 1, allowing the designer to have direct control of the resulting design. The custom specified portion of the design is merged with the portion of the design that is created from the conventional synthesis flow. The conventional synthesis flow still optionally performs sizing optimization of combinatorial logic gates, LCBs and latches. Additional inputs, as illustrated at blocks 210, 220, 230, 240, 250 can precisely control portions of the circuit level netlist and may be injected at multiple steps in the synthesis flow. The additional inputs can be provided in an exemplary "side file" (or correspondence file). As such, the method includes conventional input (which can include logic, timing and area constraints, for example) at block 205. In addition, at block 210, additional custom specifications are input. At block 220, prior to conventional high level/logic synthesis at block 215, custom decomposition components are provided in the synthesis flow. The custom decomposition components can provide specific detailed instructions provided by the designer instead of relying on the more generalized and automatic broad instructions from conventional synthesis flow. In this way, the original input is not modified. Additional custom decomposition can take place at block 230 prior to placement (i.e. non-sequential logic) at block 225. In exemplary embodiments, the custom decomposition steps can target combinatorial logic (non-sequential). At block 240, the side file can also input custom placement into the synthesis flow. At block 235, the method 200 further includes performing clock optimization and latch mapping. In exemplary embodiments, at block 250, the side file can provide custom clock optimization and latch mapping, which targets the sequential logic optimization at block 235. The method 200 then continues with final placement at block 245, optimization and refinement at block 255 and final circuit description (e.g., netlist and placement) at block 265. In exemplary embodiments, the custom components to the flow at blocks 210, 220, 230, 240, 250 can either be implemented as redefinitions of specific portions of RTL, netlist formats, or by shorthand notations. In particular, the custom clock optimization and latch mapping component at block 250 lends itself to shorthand notations, since the number of topologies is limited by the clocking network requirements.

FIG. 3 illustrates an example 300 in which a custom decomposition can provide a precise definition of logic level RTL. The example 300 includes a logic level implementation in VHDL syntax 305. In this example, the RTL master line of interest is written as a logic equation 306 (i.e., the logical AND of two inputs). Although this is a simple operation, synthesis could potentially implement this operation in many ways. In exemplary embodiments, custom decomposition is applied implementing a side file is added to synthesis specifying the exact implementation of this section of code. The side content 310 assigns precise gates and optionally gate drive strengths and threshold voltages. In exemplary embodiments, the custom decomposition side file includes only the specification for the portion of the master RTL it is expanding. Thus, portions of the master RTL that are not expanded are only defined in the master RTL, which reduces redundancy of the master RTL and custom decomposition components.

Referring again to FIG. 2, the realization of implementing the custom decomposition side file could occur at various steps in the synthesis flow. The replacement of master RTL with a custom decomposition side file in RTL form could occur prior to the synthesis process at block 215, for example. As such, the synthesis flow would not need to be altered. In exemplary embodiments, portions of the logic can be "tagged" with comments, as illustrated in FIG. 4. In FIG. 4, the master VHDL 305 is illustrated having comments 401, 402 around the logic equation 306. Corresponding comments 403, 404 also included in the side content 310

In exemplary embodiments, the synthesis process could read in the master RTL as well as the custom decomposition side file and follow the more detailed description during either high-level or logic synthesis. Tagging sections of the master RTL for replacement may or may not be needed depending on the recognition capabilities of the synthesis program. If tagging is implemented, marking the sections in the master RTL as illustrated in FIG. 4 using comments does not change the functionality of the master RTL.

In exemplary embodiments, the custom decomposition side file can include instantiations that are defined in additional side files. Thus, supplemental files may also be supplied to synthesis, as illustrated in FIG. 5, which illustrates the example of FIGS. 3 and 4, and further illustrates a supplemental custom decomposition side file 505 in accordance with exemplary embodiments.

The RTL based approach described herein allows for precisely defining the connectivity, but a precise definition is not necessarily required. For example, the custom decomposition file may describe a partial implementation and/or provide additional details but not complete implementation details.

Referring still to FIG. 2, similar realizations in terms of side files can be realized at block 250, custom clock optimization and latch mapping. In exemplary embodiments, block 250 can include fewer degrees of freedom than combinatorial synthesis steps, which allows a side file specification in a shorthand format. In exemplary embodiments, the systems and methods described herein can include a shorthand notation for controlling the synchronous portions of synthesis, which is referred to as a correspondence file, and further described herein. In exemplary embodiments, the synthesis program reads the correspondence file and directly implements the specified netlist connectivity, bypassing portions of the standard synthesis flow. The correspondence file can provide a description of either all or a portion of the synchronous circuits. In the case where only a portion of the synchronous circuits are described, synthesis processes the remaining synchronous circuits in the standard manner.

Figure 6:
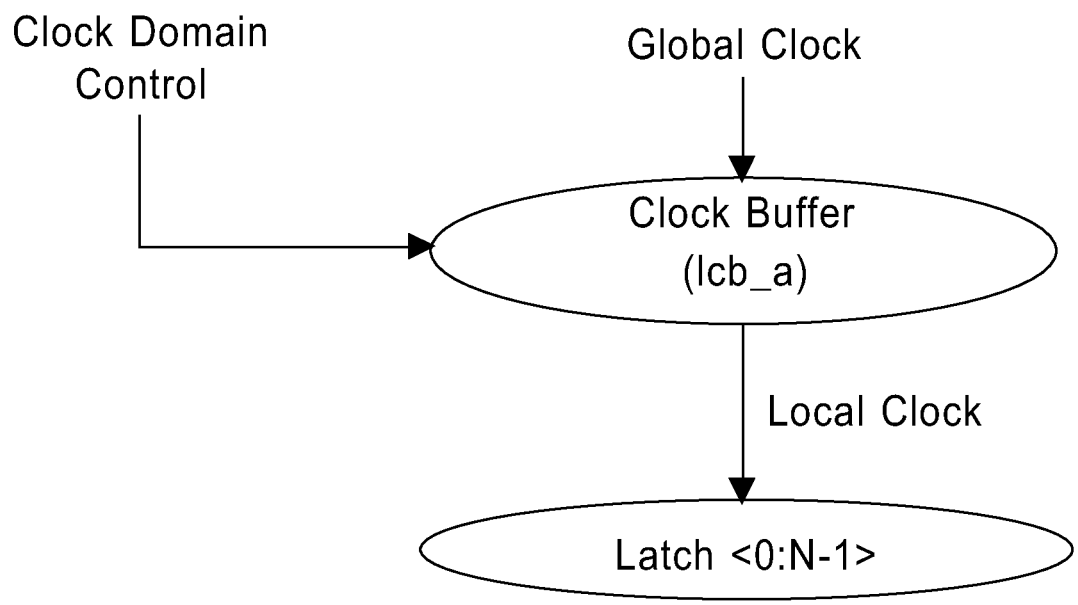
FIG. 6 illustrates a logic level diagram for storage elements in accordance with exemplary embodiments.
Figure 7:
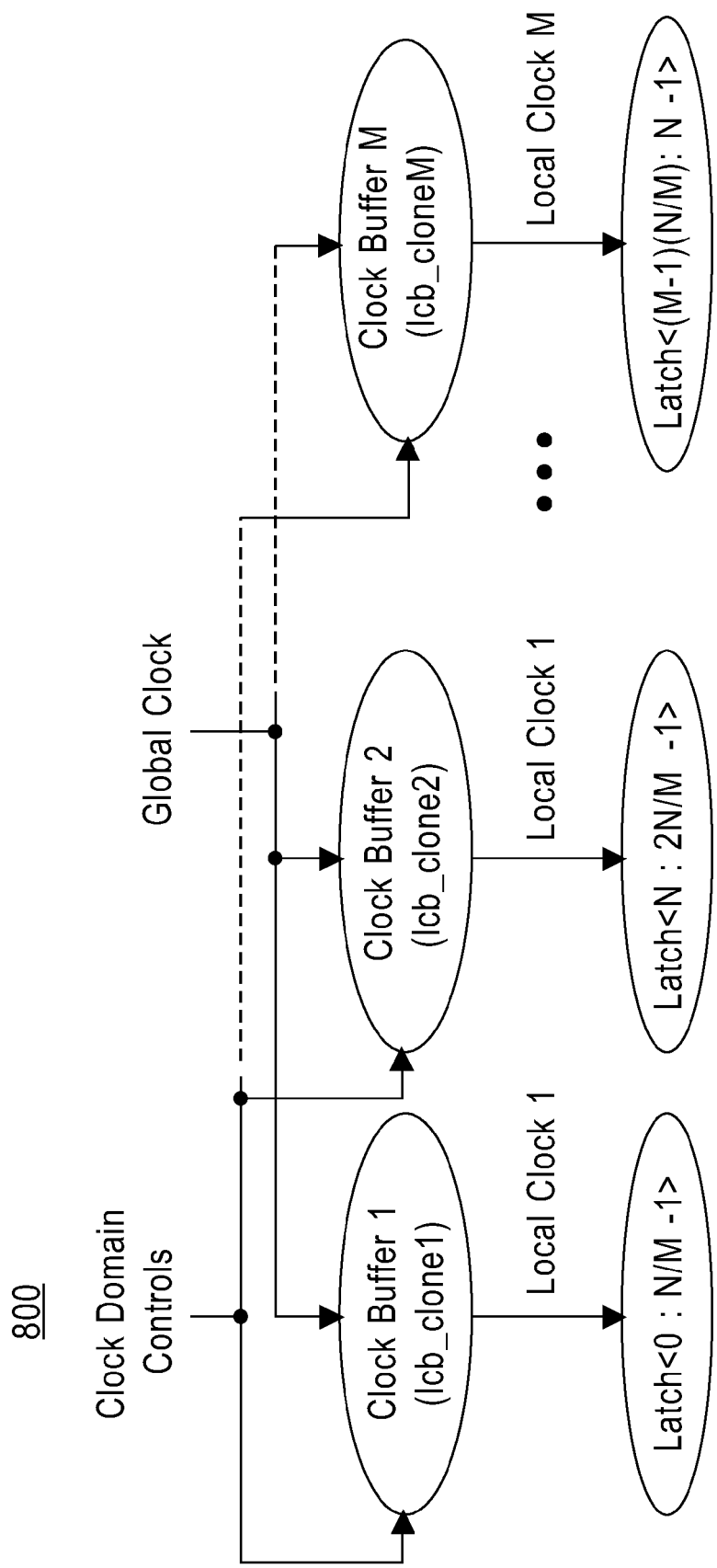
FIG. 7 illustrates a circuit level diagram for storage elements in accordance with exemplary embodiments.

In exemplary embodiments, the synchronous portions of a circuit commonly include a global clock connecting to local clock buffers (LCBs). The LCBs distribute a local clock to latches (i.e., storage elements that capture the logical state of the circuit). At the logic level, the clocking network is often partitioned into clock domains, each of which allows logically different control of the clock sequencing, e.g., clock gating. Logically, a clock domain is composed of a global clock driving a single LCB as well as additional control signals that operate upon the local clock. The local clock drives a number latches, as illustrated in FIG. 6, showing an example of a logic level diagram 600 (where N=number of latches logically in the clock domain). In contrast, the circuit level implementation of a clock domain often employs multiple LCBs in parallel (LCB clones), as illustrated in FIG. 7, showing an example of a circuit level diagram 700. In FIG. 7, N=number of latches logically in the clock domain and M=Number of LCB clones. In the example, an equal number of latches are assigned to each LCB clone, but this is not a requirement. Cloning LCBs at the circuit level allows the capacitive and resistive load of a single LCB clone to have an upper bound. The cloning of LCBs and the assignment of specific latches to specific clones can be conveyed via the correspondence file shorthand notation. An example implementation of the shorthand notation is illustrated in FIG. 8. In the example 800, groups of latches, within the same clock domain, are assigned to multiple LCB clones. The latch and LCB clone assignment information is them used directly by the synthesis program, bypassing the conventional synthesis LCB cloning steps. In the present example, the synthesis program still performs the traditional role of sizing LCB and latch components, a task eminently amenable to underlying circuit component sizing algorithms built into the synthesis program. Providing sizing information via the shorthand notation is straightforward extension to allow designer control of LCB and latch sizes.

Figure 9:
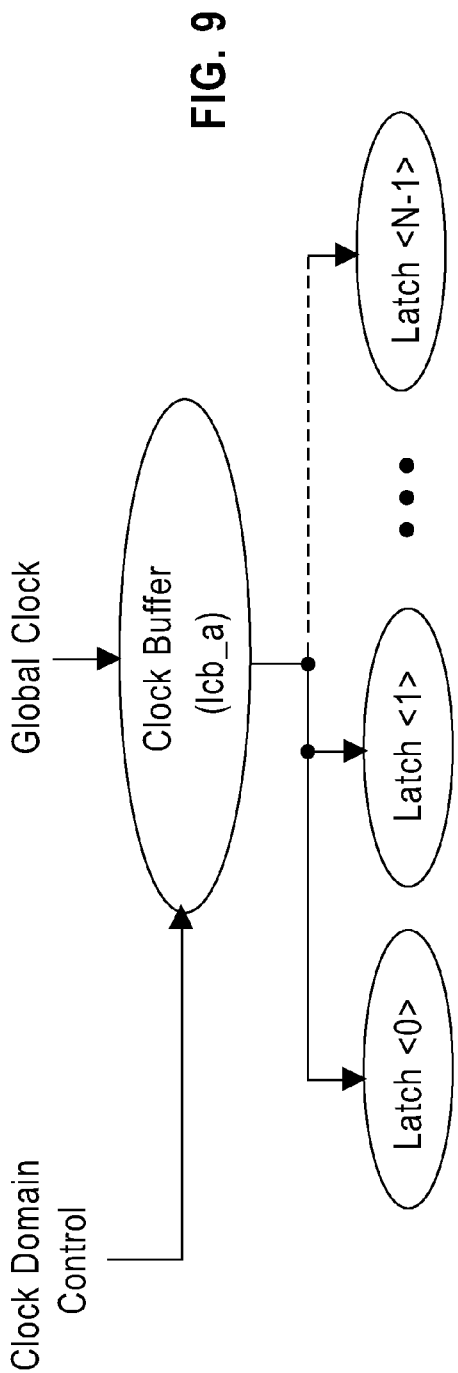
FIG. 9 illustrates a logic level diagram for latch merging in accordance with exemplary embodiments.
Figure 10:
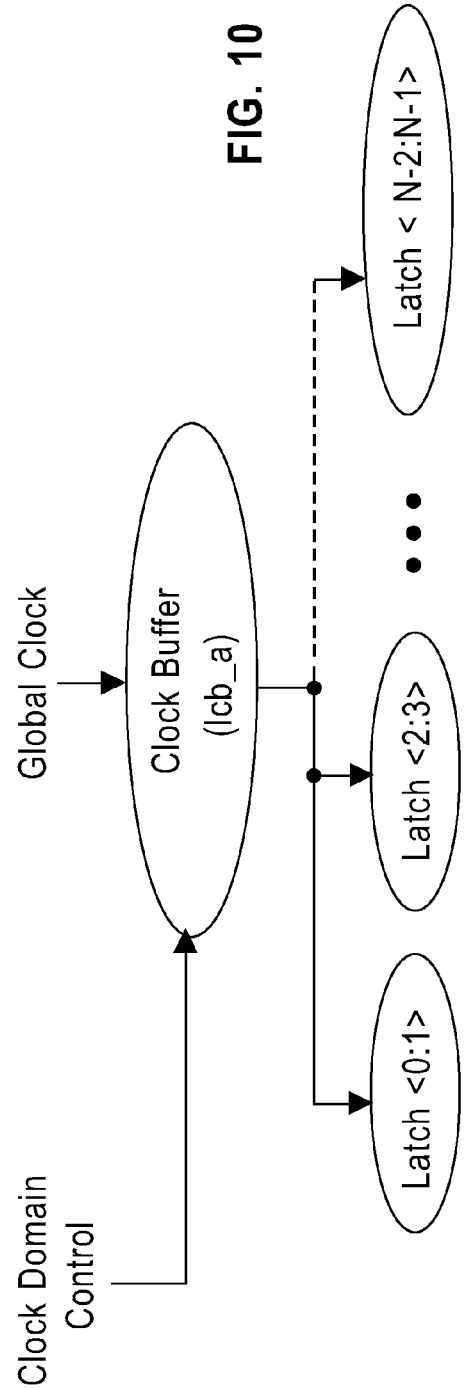
FIG. 10 illustrates a circuit level diagram for latch merging in accordance with exemplary embodiments.

Latch merging is another example of how circuit implementation details can specified via a shorthand notation in accordance with exemplary embodiments. Although latches are many times considered single components at the logic level as illustrated in FIG. 9, which illustrates a logic level diagram example 900, circuit implementation may group or merge multiple latches into compound latch cells, as illustrated in FIG. 10, which illustrates a circuit level diagram example 1000. Latch merging is another scenario where human designers may be able to make better decisions than a synthesis program in some scenarios. FIG. 11 illustrates an example of an implementation 1100 of a shorthand notation that includes latch merging, in accordance with exemplary embodiments.

Although the examples of shorthand notation illustrate in FIGS. 8 and 11 implement a column based (positional) specification, several other notations can be used for conveying the same information. For example, an xml (e.g., tagged or keyed) notation could be another implementation as illustrated in FIG. 12. This format is extensible. For example, in some cases the designer may want the synthesis program to allow additional latches to be assigned to an LCB clone that the designer specified connectivity. In other cases, the designer may want the synthesis program to only allow designer specified connectivity. These implementations can be controlled using the shorthand notation in FIG. 12 via the "exclusive" property, as shown for example, in lines 1205, 1210.

Figure 13:
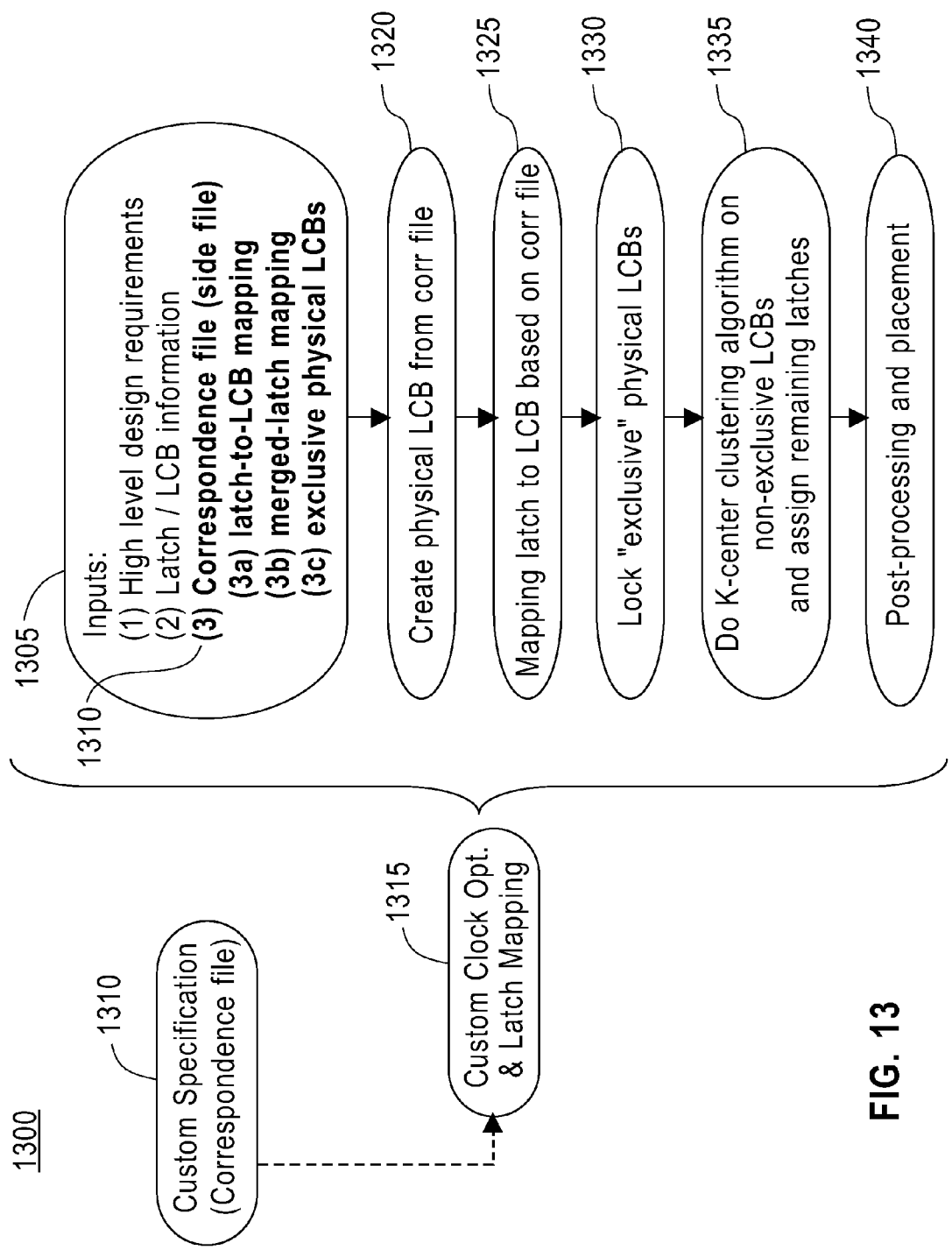
FIG. 13 illustrates a flowchart of an example of a latch/LCB assignment method 1300 in accordance with exemplary embodiments.
Figure 14:
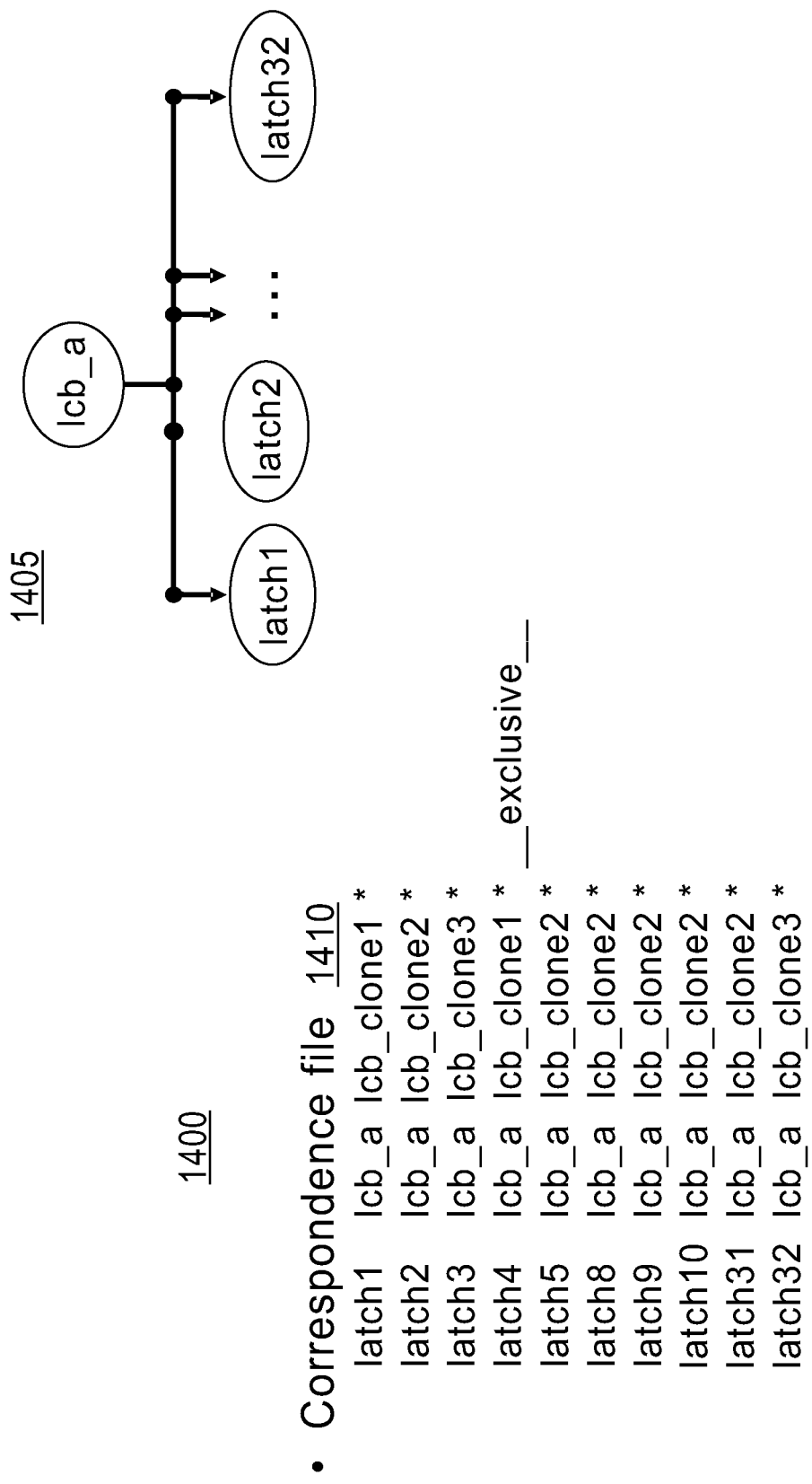
FIG. 14 illustrates an example of a logic diagram of a LCB domain and correspondence file.
Figure 15:
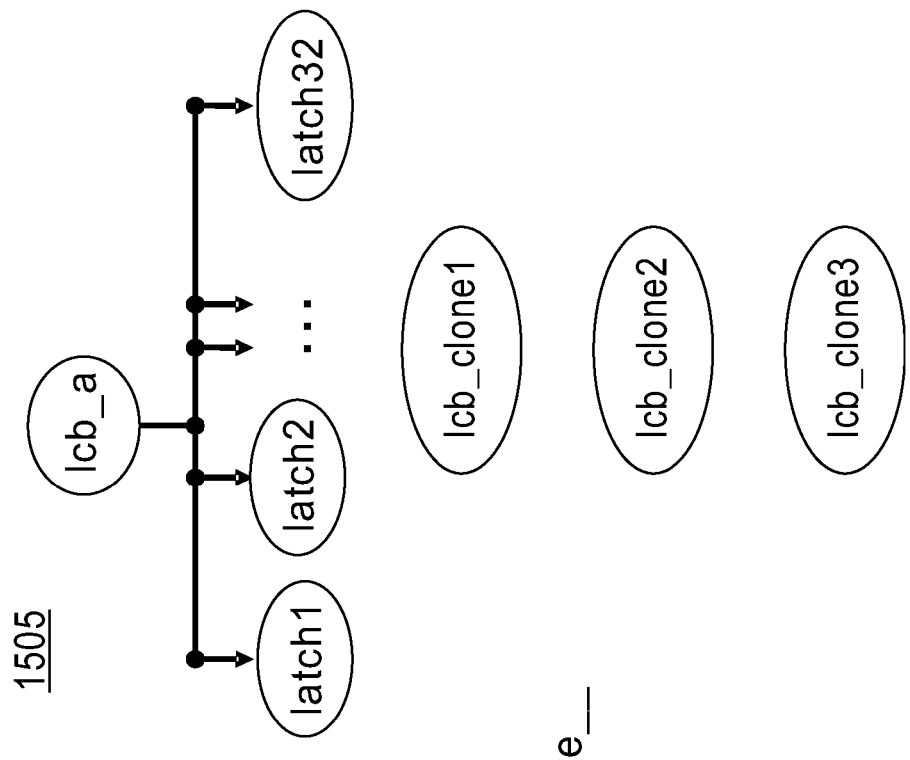
FIG. 15 illustrates an example of LCB domain logic diagram and an exemplary correspondence file.
Figure 16:
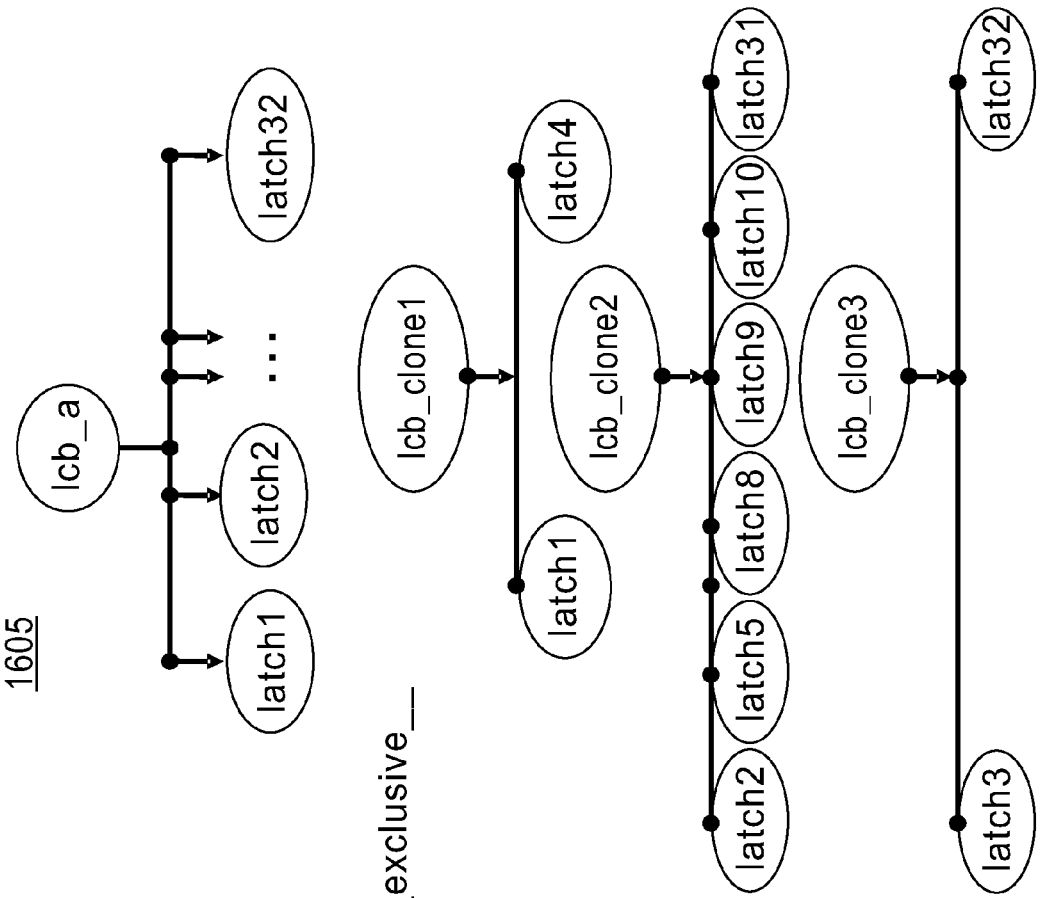
FIG. 16 illustrates an example of LCB domain logic diagram and an exemplary correspondence file.
Figure 17:
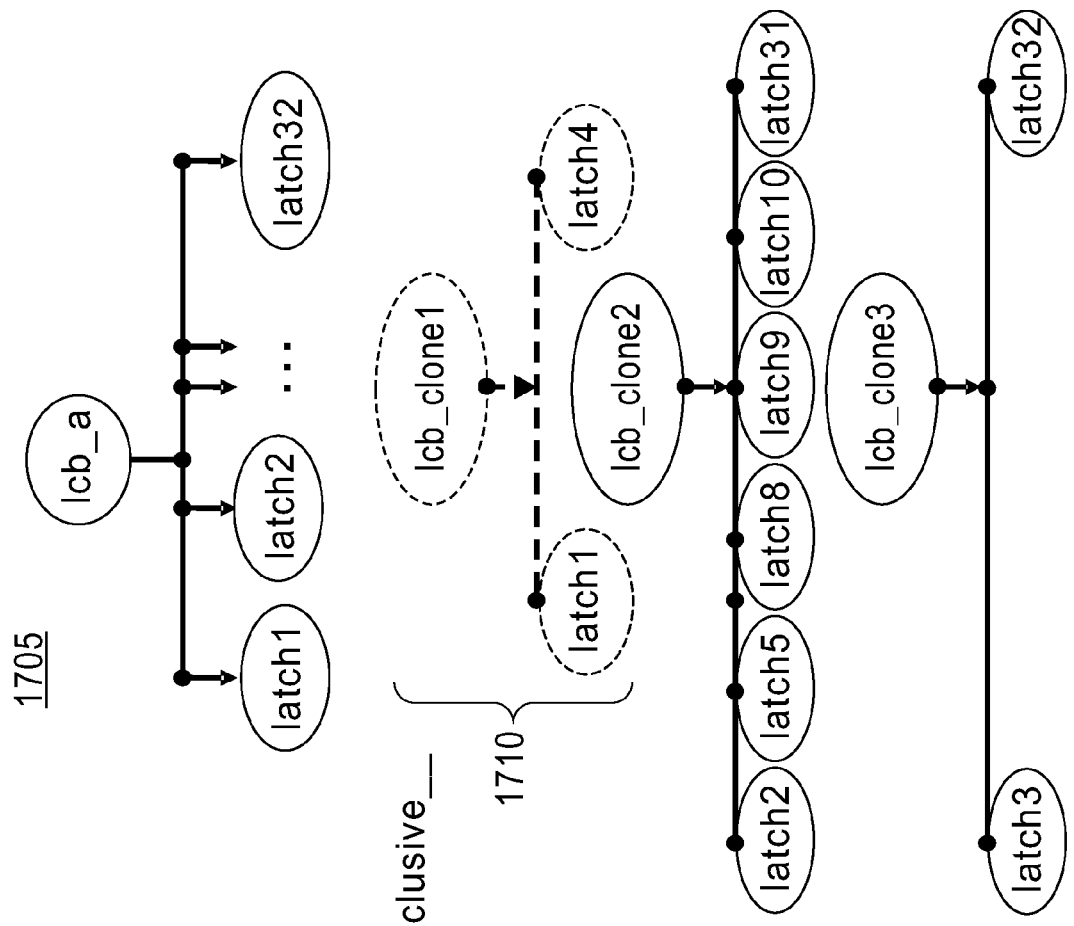
FIG. 17 illustrates an example of LCB domain logic diagram and an exemplary correspondence file.
Figure 18:
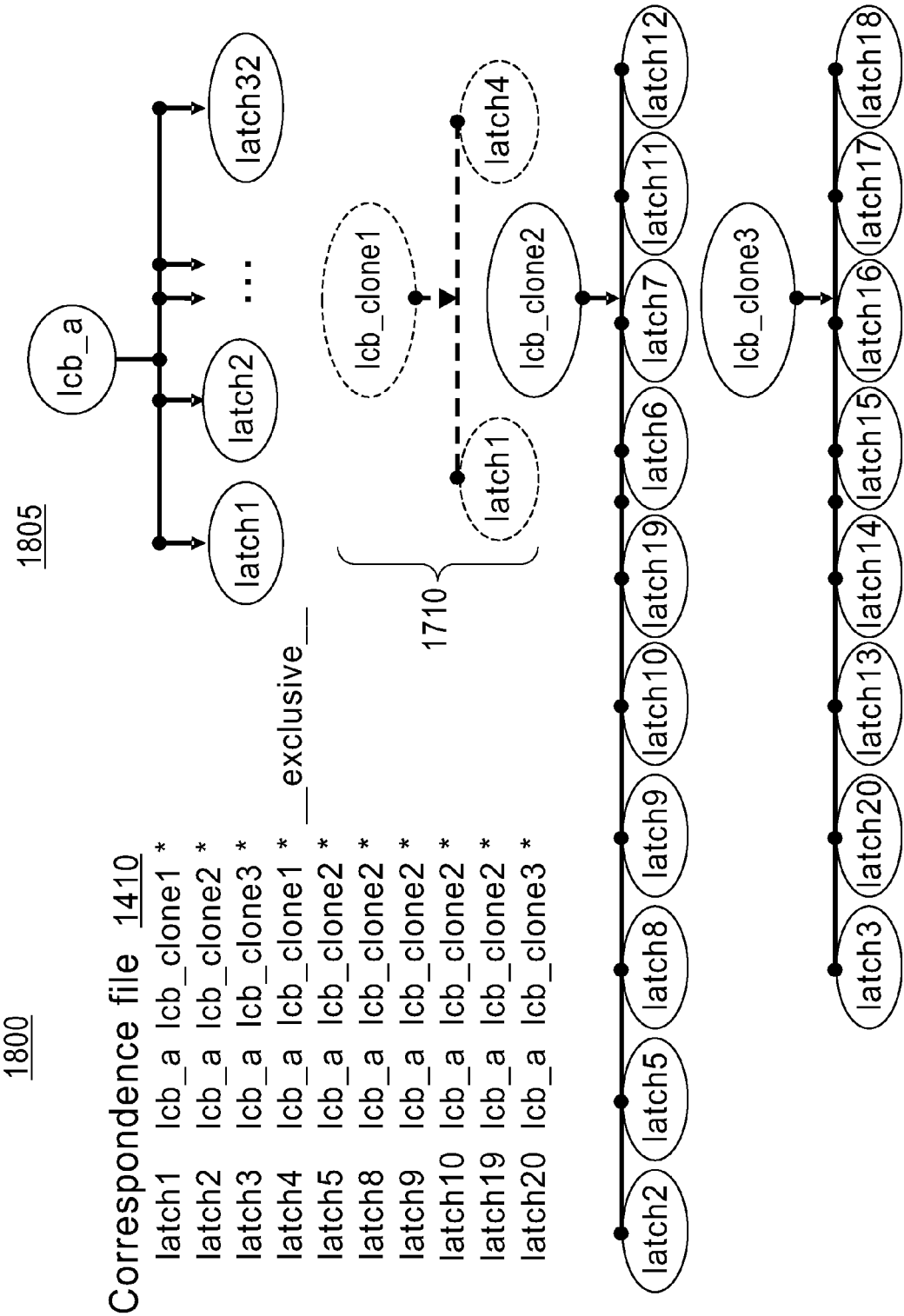
FIG. 18 illustrates an example of LCB domain logic diagram and an exemplary correspondence file.

FIG. 13 illustrates a flowchart of an example of a latch/LCB assignment method 1300 in accordance with exemplary embodiments. The example is based on a logical LCB domain that drives 32 latches as illustrated in FIG. 14, which shows a logic diagram 1405 of a LCB domain and correspondence file 1410. In the example 1400, the "*" indicates that the latch is not merged in the physical domain and the _exclusive_ keyword applies to the entire physical LCB even if it is illustrated in only one row. At block 1305 input is provided into the synthesis flow in accordance with exemplary embodiments. In the example, the input includes, but not is limited to a high level description of the design from the prior synthesis step, latch/LCB information and requirements as well as the correspondence file, i.e., side file. The exemplary correspondence file (block 1310) can include but is not limited to latch-to-LCB mapping, merged-latch mapping and exclusive physical LCBs. Block 1315 is an excerpt from FIG. 2 (blocks 210, 250). Detailing the custom clock optimization and latch mapping flow, block 1315 is expanded into blocks 1320, 1325, 1330, 1335, and 1340. At block 1320, the method 1300 can include creating physical LCBs from the correspondence file. FIG. 15 illustrates an example 1500 showing a LCB domain logic diagram 1505 showing the creation of the physical LCBs, as well as the correspondence file 1410. FIG. 16 illustrates an example 1600 showing a LCB domain logic diagram 1605 showing the mapping of the latch to the LCB, as well as the correspondence file 1410. At block, 1325, the method 1300 can further include locking "exclusive" physical LCBs. FIG. 17 illustrates an example 1700 showing a LCB domain logic diagram 1705 showing the locking of physical LCBs with _exclusive_ keyword at the hashed portions 1710, as well as the correspondence file 1410. At block 1330, the method 1300 can further include performing K-center clustering algorithm on non-exclusive LCBs and assigning remaining latches. FIG. 18 illustrates an example 1800 showing a LCB domain logic diagram 1805 showing the application of the K-center clustering algorithm and the assignment of the remaining latches, as well as the correspondence file 1410. In exemplary embodiments, the real latch-to-LCB mapping depends on physical proximity, free space for LCB placement, and/or timing of the latch data signals. At block 1340, the method 1300 can further include post-processing and placement.

Referring again to FIG. 2, block 240 illustrates custom placement of components. In exemplary embodiments, block 240 incorporates exemplary placement as described herein to control the netlist. Block 240 also implements conventional processes to control the gate placements. The exemplary flows described herein are hybrid processes, allowing portions of the design to be implemented with the conventional synthesis flow and portions to be implementation with the custom steps.

The methods described herein can be implemented in any suitable computer system as now described.

Figure 19:
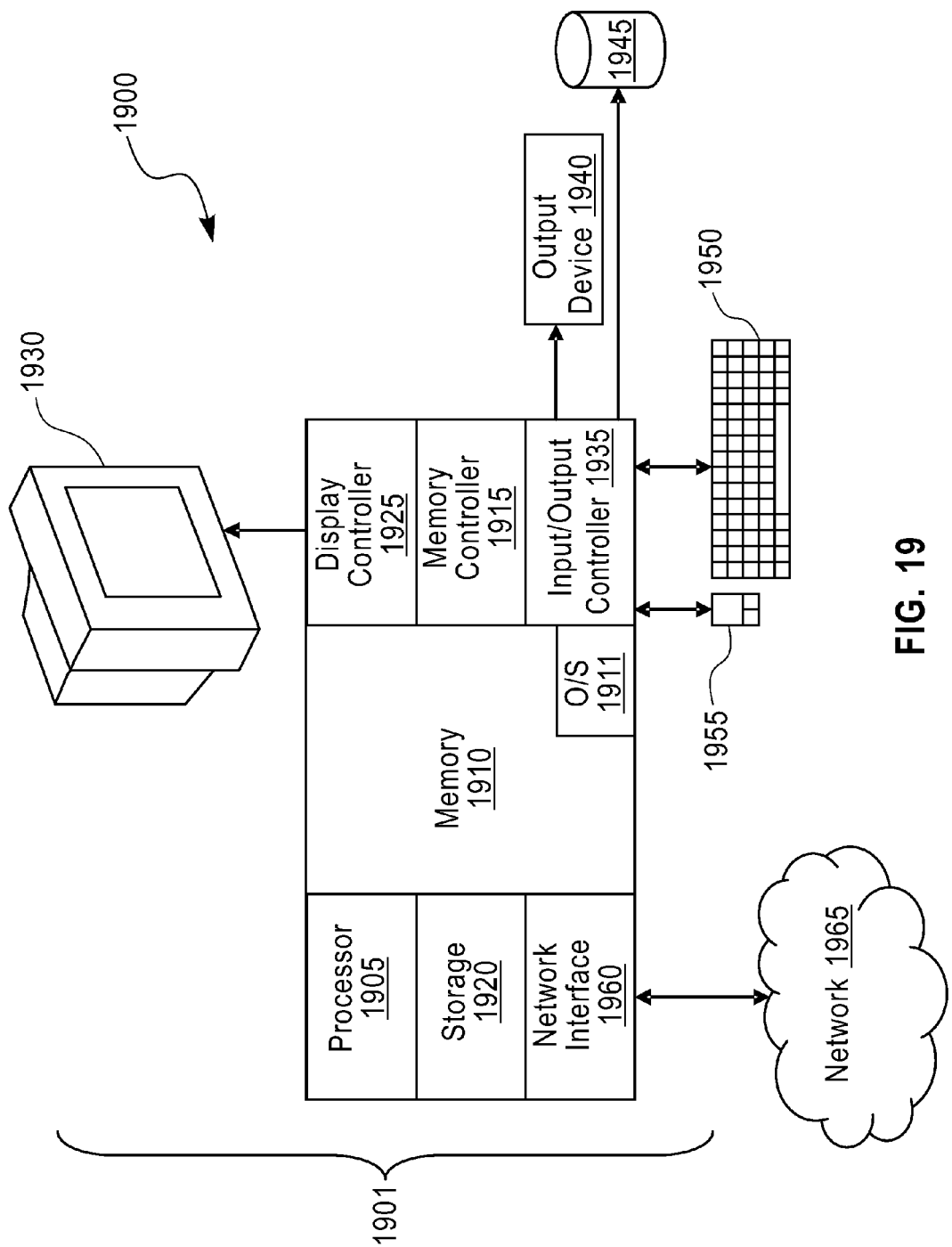
FIG. 19 illustrates an exemplary embodiment of a system for specifying circuit level connectivity during logic circuit synthesis without modifying the logic level description.

FIG. 19 illustrates an exemplary embodiment of a system 1900 for specifying circuit level connectivity during logic circuit synthesis without modifying the logic level description. The methods described herein can be implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 1900 therefore includes general-purpose computer 1901.

In exemplary embodiments, in terms of hardware architecture, as shown in FIG. 19, the computer 1901 includes a processor 1905, memory 1910 coupled to a memory controller 1915, and one or more input and/or output (I/O) devices 1940, 1945 (or peripherals) that are communicatively coupled via a local input/output controller 1935. The input/output controller 1935 can be, but is not limited to, one or more buses or other wired or wireless connections, as is known in the art. The input/output controller 1935 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 1905 is a hardware device for executing software, particularly that stored in memory 1910. The processor 1905 can be any custom made or commercially available processor, a central processing unit (CPU), an auxiliary processor among several processors associated with the computer 1901, a semiconductor based microprocessor (in the form of a microchip or chip set), a macroprocessor, or generally any device for executing software instructions.

The memory 1910 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1910 may incorporate electronic, magnetic, optical, and/or other types of storage media. Note that the memory 1910 can have a distributed architecture, where various components are situated remote from one another, but can be accessed by the processor 1905.

The software in memory 1910 may include one or more separate programs, each of which comprises an ordered listing of executable instructions for implementing logical functions. In the example of FIG. 19, the software in the memory 1910 includes the circuit level connectivity synthesis methods described herein in accordance with exemplary embodiments and a suitable operating system (OS) 1911. The operating system 1911 essentially controls the execution of other computer programs, such the circuit level connectivity synthesis systems and methods as described herein, and provides scheduling, input-output control, file and data management, memory management, and communication control and related services.

The circuit level connectivity synthesis methods described herein may be in the form of a source program, executable program (object code), script, or any other entity comprising a set of instructions to be performed. When a source program, then the program needs to be translated via a compiler, assembler, interpreter, or the like, which may or may not be included within the memory 1910, so as to operate properly in connection with the OS 1911. Furthermore, the circuit level connectivity synthesis methods can be written as an object oriented programming language, which has classes of data and methods, or a procedure programming language, which has routines, subroutines, and/or functions.

In exemplary embodiments, a conventional keyboard 1950 and mouse 1955 can be coupled to the input/output controller 1935. Other output devices such as the I/O devices 1940, 1945 may include input devices, for example but not limited to a printer, a scanner, microphone, and the like. Finally, the I/O devices 1940, 1945 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 1900 can further include a display controller 1925 coupled to a display 1930. In exemplary embodiments, the system 1900 can further include a network interface 1960 for coupling to a network 1965. The network 1965 can be an IP-based network for communication between the computer 1901 and any external server, client and the like via a broadband connection. The network 1965 transmits and receives data between the computer 1901 and external systems. In exemplary embodiments, network 1965 can be a managed IP network administered by a service provider. The network 1965 may be implemented in a wireless fashion, e.g., using wireless protocols and technologies, such as WiFi, WiMax, etc. The network 1965 can also be a packet-switched network such as a local area network, wide area network, metropolitan area network, Internet network, or other similar type of network environment. The network 1965 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 1901 is a PC, workstation, intelligent device or the like, the software in the memory 1910 may further include a basic input output system (BIOS) (omitted for simplicity). The BIOS is a set of essential software routines that initialize and test hardware at startup, start the OS 1911, and support the transfer of data among the hardware devices. The BIOS is stored in ROM so that the BIOS can be executed when the computer 1901 is activated.

When the computer 1901 is in operation, the processor 1905 is configured to execute software stored within the memory 1910, to communicate data to and from the memory 1910, and to generally control operations of the computer 1901 pursuant to the software. The circuit level connectivity synthesis methods described herein and the OS 1911, in whole or in part, but typically the latter, are read by the processor 1905, perhaps buffered within the processor 1905, and then executed.

When the systems and methods described herein are implemented in software, as is shown in FIG. 19, the methods can be stored on any computer readable medium, such as storage 1920, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the circuit level connectivity synthesis methods are implemented in hardware, the circuit level connectivity synthesis methods described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects include the ability for the designer to deterministically control connections in portions of the netlist generated by the synthesis program. Presently, synthesis programs provide settings to allow designers to influence results, but the settings provide only general guidance to the program and do not specify precise and deterministic connectivity. Technical effects further include the ability to deterministically control connectivity without modifying the original logic level description. Presently, designers can modify the original logic level description to control connectivity. Furthermore, technical effects include a flow that allows the injection the deterministic control at multiple steps in a synthesis flow. In addition, the flow also includes options to use previously known side files, such as custom placement files, which allows both deterministic control over connectivity and gates in the netlist as well as deterministic placement of gates.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. In a computer system having a processor and a memory, a method for modifying a logic circuit synthesis flow having automated instructions, the method comprising:
receiving in the memory an automated circuit design input for a circuit design;
receiving in the memory a custom decomposition side file having custom specifications to the automated circuit design input, bypassing the automated circuit design input for the circuit design, but leaving the automated circuit design input intact, wherein the custom decomposition side file includes only specifications for a portion of the logic circuit synthesis flow being expanded, thereby reducing redundancy of the logic circuit synthesis flow, wherein the specifications for the portion that are included in the custom decomposition side file define one implementation of the portion while specifications for the portion that are included in the automated circuit design input define a plurality of different implementations of the portion;
synthesizing high level logic from the automated circuit design input in the processor;
placing logic on the circuit design in the processor;
refining the circuit design in the processor; and
generating a circuit description from the circuit design in the processor.

2. The method as claimed in claim 1 wherein the logic circuit synthesis flow is register transfer level (RTL) synthesis.

3. The method as claimed in claim 2 wherein the custom specifications include a redefinition of a portion of the RTL synthesis.

4. The method as claimed in claim 1 wherein the custom specifications include a redefinition of netlist format.

5. The method as claimed in claim 1 wherein the custom specifications include shorthand notation.

6. The method as claimed in claim 5 further comprising bypassing the automated instructions in the logic circuit synthesis flow by reading the shorthand notation that provides instructions including a description synchronous clocked portions of the logic circuit synthesis flow.

7. The method as claimed in claim 6 further comprising merging the custom specifications with the logic circuit synthesis flow.

8. The method as claimed in claim 1 further comprising running clock optimization and latch mapping algorithms.

9. The method as claimed in claim 8 wherein the custom specifications include custom clock optimization and latch mapping that target sequential logic optimization.

10. The method as claimed in claim 1 wherein the custom specifications bypass the automated instructions, but do not alter the logic level description.

11. A computer program product for modifying a logic circuit synthesis flow having automated instructions, the computer program product having a computer readable medium including instructions for causing a computer to implement a method, the method comprising:
    receiving an automated circuit design input for a circuit design;
    receiving a custom decomposition side file having custom specifications to the automated circuit design input, bypassing the automated circuit design input for the circuit design, but leaving the automated circuit design input intact, wherein the custom decomposition side file includes only specifications for a portion of the logic circuit synthesis flow being expanded, thereby reducing redundancy of the logic circuit synthesis flow, wherein the specifications for the portion that are included in the custom decomposition side file define one implementation of the portion while specifications for the portion that are included in the automated circuit design input define a plurality of different implementations of the portion;
    synthesizing high level logic from the automated circuit design input;
    placing logic on the circuit design;
    refining the circuit design; and
    generating a circuit description from the circuit design.

12. The computer program product as claimed in claim 11 wherein the logic circuit synthesis flow is register transfer level (RTL) synthesis.

13. The computer program product as claimed in claim 12 wherein the custom specifications include a redefinition of a portion of the RTL synthesis.

14. The computer program product as claimed in claim 11 wherein the custom specifications include a redefinition of netlist format.

15. The computer program product as claimed in claim 11 wherein the custom specifications include shorthand notation.

16. The method as claimed in claim 15 wherein the method further comprises bypassing the automated instructions in the logic circuit synthesis flow by reading the shorthand notation that provides instructions including a description synchronous portions of the logic circuit synthesis flow.

17. The computer program product as claimed in claim 16 wherein the method further comprises merging the custom specifications with the logic circuit synthesis flow.

18. The computer program product as claimed in claim 11 wherein the method further comprises running clock optimization and latch mapping algorithms.

19. The computer program product as claimed in claim 18 wherein the custom specifications include custom clock optimization and latch mapping that target sequential logic optimization.

20. The computer program product as claimed in claim 11 wherein the custom specifications bypass the automated instructions, but do not alter the logic level description.

21. In a computer system having a processor and a memory, a method of modifying a logic circuit synthesis flow having automated instructions, the method comprising:
    receiving a circuit design input in the memory;
    running high level synthesis for the circuit design in the processor;
    receiving custom decomposition instructions related to high level synthesis of the circuit design and for bypassing portions of the automated instructions, but leaving the automated instructions intact, wherein the custom decomposition instructions includes only specifications for a portion of the logic circuit synthesis flow being expanded, thereby reducing redundancy of the logic circuit synthesis flow, wherein the specifications for the portion that are included in the custom decomposition instructions define one implementation of the portion while specifications for the portion that are included in the automated instructions define a plurality of different implementations of the portion;
    running placement algorithms for non-sequential logic of the circuit design in the processor;
    receiving custom decomposition instructions related to high level synthesis of the circuit design and for bypassing portions of the automated instructions in the processor;
    running clock optimization and latch mapping algorithms for the circuit design in the processor; and
    receiving custom decomposition instructions related clock optimization and latch mapping and for bypassing portions of the automated instructions in the processor.

22. The method as claimed in claim 21 further comprising:
    generating final placement for the circuit design;
    optimizing and refining the circuit design; and
    generating a final circuit description for the circuit design.

23. A computer program product for modifying a logic circuit synthesis flow having automated instructions, the computer program product having a non-transitory computer readable medium including instructions for causing a computer to implement a method, the method comprising:
    receiving a circuit design input;
    running high level synthesis for the circuit design;
    receiving custom decomposition instructions related to high level synthesis of the circuit design and for bypassing portions of the automated instructions, but leaving the automated instructions intact, wherein the custom decomposition instructions includes only specifications for a portion of the logic circuit synthesis flow being expanded, thereby reducing redundancy of the logic circuit synthesis flow, wherein the specifications for the portion that are included in the custom decomposition instructions define one implementation of the portion while specifications for the portion that are included in the automated instructions define a plurality of different implementations of the portion;
    running placement algorithms for non-sequential logic of the circuit design;
    receiving custom decomposition instructions related to high level synthesis of the circuit design and for bypassing portions of the automated instructions;
    running clock optimization and latch mapping algorithms for the circuit design; and
    receiving custom decomposition instructions related clock optimization and latch mapping and for bypassing portions of the automated instructions.

24. The computer program product as claimed in claim 23 wherein the method further comprises:
    generating final placement for the circuit design;
    optimizing and refining the circuit design; and
    generating a final circuit description for the circuit design.

25. A system for modifying a logic circuit synthesis flow, the system comprising:
a processor configured to:
receive circuit design input for a circuit design;
receive custom specifications to the circuit design input;
synthesize high level logic from the circuit design input;
place logic on the circuit design;
refine the circuit design; and
generate a circuit description from the circuit design;
a memory operationally coupled to the processor, the memory including:
automated instructions for the logic circuit synthesis flow;
a correspondence file including custom user-provided decomposition instructions for bypassing the automated instructions, but leaving the automated instructions intact, wherein the correspondence file includes only specifications for a portion of the logic circuit synthesis flow being expanded, thereby reducing redundancy of the logic circuit synthesis flow, wherein the specifications for the portion that are included in the correspondence file define one implementation of the portion while specifications for the portion that are included in the automated instructions define a plurality of different implementations of the portion; and
a supplemental correspondence file including custom instantiations.

* * * * *